(12) United States Patent
Kato

(10) Patent No.: US 11,196,233 B2
(45) Date of Patent: Dec. 7, 2021

(54) QUANTUM CASCADE LASER

(71) Applicant: SUMITOMO ELECTRIC INDUSTRIES, LTD., Osaka (JP)

(72) Inventor: Takashi Kato, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 16/752,682

(22) Filed: Jan. 26, 2020

(65) Prior Publication Data
US 2020/0244042 A1 Jul. 30, 2020

(30) Foreign Application Priority Data

Jan. 30, 2019 (JP) .............................. JP2019-014394

(51) Int. Cl.
*H01S 5/34* (2006.01)
*B82Y 20/00* (2011.01)
*H01S 5/40* (2006.01)

(52) U.S. Cl.
CPC ............ *H01S 5/3402* (2013.01); *H01S 5/405* (2013.01); *B82Y 20/00* (2013.01)

(58) Field of Classification Search
CPC .. H01S 5/3402; H01S 5/3407; H01S 5/34346; H01S 5/40; H01L 31/035236; G02F 1/017; G02F 1/01725
See application file for complete search history.

(56) References Cited

U.S. PATENT DOCUMENTS

| | | | |
|---|---|---|---|
| 2005/0173694 A1* | 8/2005 | Mawst | B82Y 20/00 257/14 |
| 2012/0230359 A1* | 9/2012 | Kato | H01S 5/3402 372/45.01 |
| 2015/0123077 A1* | 5/2015 | Cho | G02F 1/01725 257/21 |
| 2018/0183213 A1* | 6/2018 | Katsuyama | H01S 5/3408 |
| 2018/0261981 A1* | 9/2018 | Katsuyama | H01S 5/0424 |

FOREIGN PATENT DOCUMENTS

JP 2012-186362 A 9/2012

* cited by examiner

*Primary Examiner* — Tuan N Nguyen
(74) *Attorney, Agent, or Firm* — Volpe Koenig

(57) ABSTRACT

A quantum cascade laser has a core region including a first injection layer, an active region, and a second injection layer. The active region includes a first well layer, a second well layer, a third well layer, a first barrier layer, and a second barrier layer. The first barrier layer is disposed between the first well layer and the second well layer and separates the first well layer from the second well layer. The second barrier layer is disposed between the second well layer and the third well layer and separates the second well layer from the third well layer. The first barrier layer has a thickness of 1.2 nm or less, and the second barrier layer has a thickness of 1.2 nm or less.

3 Claims, 4 Drawing Sheets

QUANTUM CASCADE LASER

BACKGROUND OF THE INVENTION

1. Field of the Invention

The present invention relates to quantum cascade lasers.

2. Description of the Related Art

Japanese Unexamined Patent Application Publication No. 2012-186362 (Patent Document 1) discloses a quantum cascade laser.

The quantum cascade laser in Patent Document 1 has an active region including three well layers with similar thicknesses and barrier layers disposed upstream and downstream of these well layers and separating the well layers from each other. Patent Document 1 focuses on the thicknesses of the upstream barrier layers from the viewpoint of the shapes of the wavefunctions of upper and lower levels.

According to research conducted by the inventor, the probability density (the square of the wavefunction) of electrons (carriers) in the band diagram of the active region disclosed in Patent Document 1 is lower in the downstream well layers. It is desirable to increase the probability of radiative transitions in a plurality of well layers in an active region.

SUMMARY OF THE INVENTION

An object of one aspect of the present invention is to provide a quantum cascade laser having a quantum well structure that allows for a broad distribution of carriers over a plurality of well layers in an active region.

A quantum cascade laser according to one aspect of the present invention includes a core region including a first well layer, a second well layer, a third well layer, a first barrier layer, and a second barrier layer. The core region has a first injection layer, an active region, and a second injection layer. The first injection layer, the active region, and the second injection layer are arranged in sequence in the direction of a first axis. The active region includes the first well layer, the second well layer, the third well layer, the first barrier layer, and the second barrier layer. The first barrier layer is disposed between the first well layer and the second well layer and separates the first well layer from the second well layer. The second barrier layer is disposed between the second well layer and the third well layer and separates the second well layer from the third well layer. The first barrier layer has a thickness of 1.2 nm or less. The second barrier layer has a thickness of 1.2 nm or less.

The above and other objects, features, and advantages of the present invention will become more readily apparent from the following detailed description of a preferred embodiment of the present invention taken in conjunction with the accompanying drawings.

DESCRIPTION OF THE PREFERRED EMBODIMENTS

Figure 1:
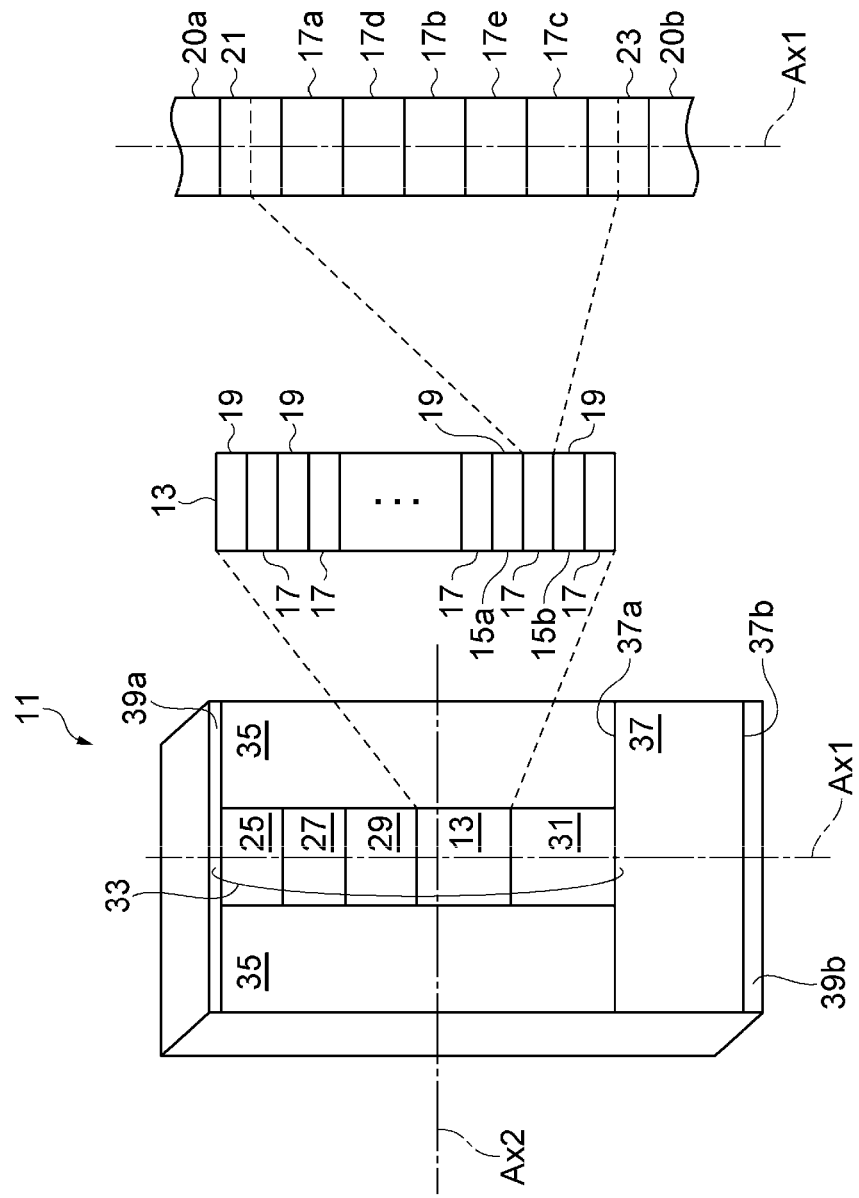
FIG. 1 schematically shows a quantum cascade laser according to the embodiment.

Some specific examples will now be described.

A specific example of a quantum cascade laser includes a core region including a first injection layer, an active region, and a second injection layer. The first injection layer, the active region, and the second injection layer are arranged in sequence in the direction of a first axis. The active region includes a first well layer, a second well layer, a third well layer, a first barrier layer, and a second barrier layer. The first barrier layer is disposed between the first well layer and the second well layer and separates the first well layer from the second well layer. The second barrier layer is disposed between the second well layer and the third well layer and separates the second well layer from the third well layer. The first barrier layer has a thickness of 1.2 nm or less. The second barrier layer has a thickness of 1.2 nm or less.

In the quantum cascade laser, the active region is provided with a quantum well structure including the first barrier layer and the second barrier layer, each of which has a thickness of 1.2 nm or less. This quantum well structure forms upper and lower energy levels that do not result in a forbidden radiative transition, and the first barrier layer and the second barrier layer, each of which has a thickness of 1.2 nm or less, allow carriers at the upper and lower energy levels to be spread and distributed over the first well layer, the second well layer, and the third well layer. Owing to the thinness of the first and second barrier layers, the probability density of carriers can spread widely in the active region. The spreading of the probability density in the active region can increase the probability of radiative transitions in a plurality of well layers in an active region.

In a specific example of a quantum cascade laser, the core region further includes a third barrier layer separating the first well layer from a well layer of the first injection layer and a fourth barrier layer separating the third well layer from a well layer of the second injection layer. The third barrier layer and the fourth barrier layer are each thicker than the first barrier layer and the second barrier layer. The first well layer is separated from the well layer of the first injection layer by the third barrier layer. The third well layer is separated from the well layer of the second injection layer by the fourth barrier layer.

In the quantum cascade laser, the thick third barrier layer can accept carriers from the well layer of the upstream injection layer through resonant tunneling and can confine the carriers within the first well layer of the active region owing to its thickness. The thick fourth barrier layer can confine carriers within the third well layer, in which the probability density of carriers is high due to the presence of the thin second barrier layer, and can donate the carriers to the well layer of the downstream injection layer through resonant tunneling.

A specific example of a quantum cascade laser further includes a substrate having a main surface supporting the core region. The main surface of the substrate contains InP. The first well layer, the second well layer, and the third well layer each contain GaInAs. The first barrier layer and the second barrier layer each contain AlInAs. The core region is strain-compensated.

In the quantum cascade laser, the first barrier layer and the second barrier layer are subjected to tensile strain, whereas the first well layer, the second well layer, and the third well layer are subjected to compressive strain. The strain-compensated core region has a larger band offset than a lattice-matched core region.

A specific example of a quantum cascade laser further includes a contact layer of a first conductivity type, a grating layer, a first cladding layer of the first conductivity type, a second cladding layer of the first conductivity type, and an embedding region. The grating layer is disposed between the first cladding layer and the second cladding layer. The core region is disposed between the contact and first cladding layers and the second cladding layer.

In the quantum cascade laser, the core region can be optically coupled to the grating layer between the first cladding layer and the second cladding layer.

The findings of the present invention can be easily understood from the following detailed description with reference to the accompanying drawings, which are given by way of example. A quantum cascade laser according to one embodiment will next be described with reference to the accompanying drawings. Where possible, like parts are denoted by like reference numerals.

Figure 2:
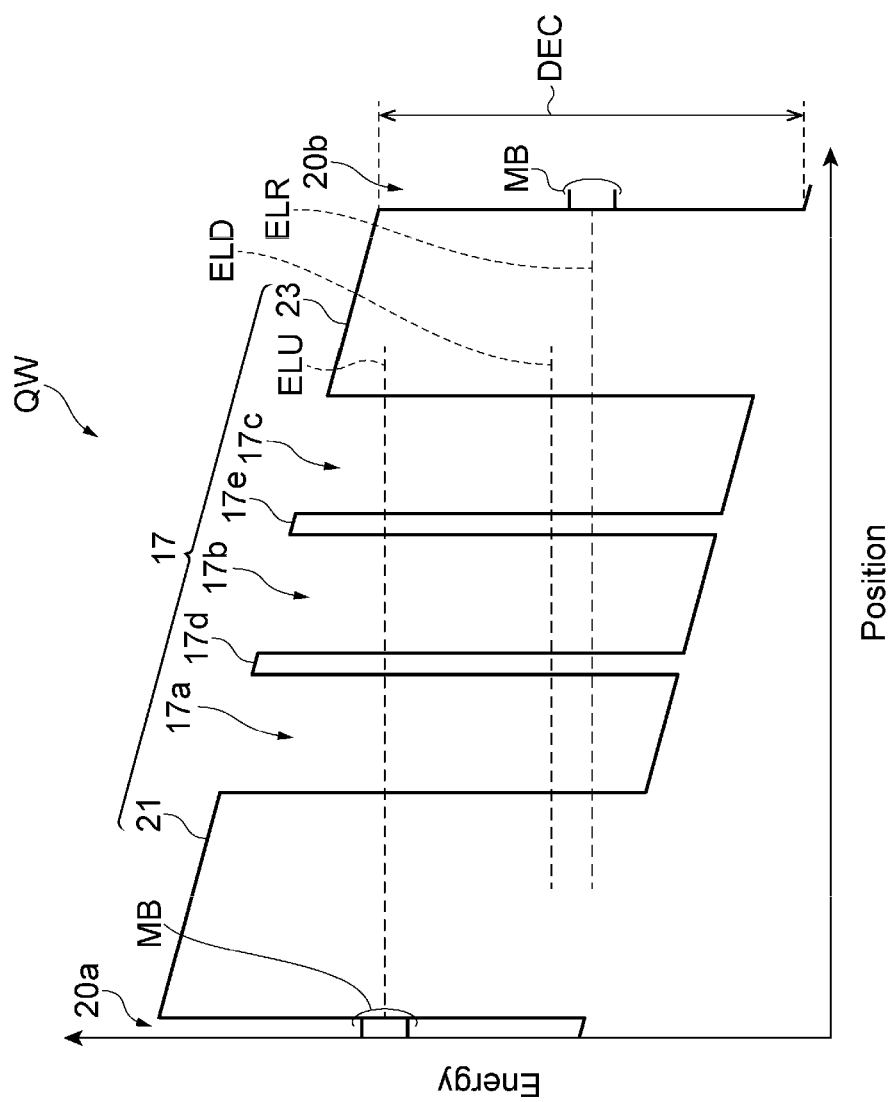
FIG. 2 schematically shows a conduction band diagram of an active region in the quantum cascade laser according to the embodiment.

FIG. 1 schematically shows a quantum cascade laser according to the embodiment. FIG. 2 schematically shows a conduction band diagram of an active region in the quantum cascade laser according to the embodiment.

A quantum cascade laser 11 includes a core region 13. The core region 13 includes alternately arranged active regions 17 and injection layers 19. The injection layer 19 includes a first injection layer 15a and a second injection layer 15b. Specifically, in the core region 13, the first injection layer 15a, the active region 17, and the second injection layer 15b are arranged in sequence in the direction of a first axis Ax1. By applying an external electrical field, the miniband MB of the first injection layer 15a can be coupled to one level of the active region 17, and another level of the active region 17 can be coupled to the miniband MB of the second injection layer 15b.

The core region 13 includes a first well layer 17a, a second well layer 17b, a third well layer 17c, a first barrier layer 17d, and a second barrier layer 17e. The first barrier layer 17d is disposed between the first well layer 17a and the second well layer 17b and separates the first well layer 17a from the second well layer 17b. The first barrier layer 17d has a thickness of 1.2 nm or less. The second barrier layer 17e is disposed between the second well layer 17b and the third well layer 17c and separates the second well layer 17b from the third well layer 17c. The second barrier layer 17e has a thickness of 1.2 nm or less.

Each active region 17 includes the first well layer 17a, the second well layer 17b, the third well layer 17c, the first barrier layer 17d, and the second barrier layer 17e. The active regions 17 have a band offset DEC in the conduction band.

As shown in FIG. 2, the active regions 17 provide an upper energy level ELU and a lower energy level ELD that allow radiative transitions. The active regions 17 further provide a relaxation energy level ELR slightly lower than the lower energy level ELD. Carriers at the lower energy level ELD transition to the relaxation energy level ELR through phonon scattering.

In the quantum cascade laser 11, the active regions 17 are provided with a quantum well structure QW including the second well layer 17b sandwiched between the first barrier layer 17d and the second barrier layer 17e. Each of the barrier layers 17d and 17e have a thickness of 1.2 nm or less. This quantum well structure QW has a type I structure, and the first barrier layer 17d and the second barrier layer 17e allow carriers (e.g., electrons) at the upper energy level ELU and the lower energy level ELD to be spread over the first well layer 17a, the second well layer 17b, and the third well layer 17c. The spreading of the carriers are attributed to the thinness of the first and second barrier layers 17d, 17e.

The core region 13 further includes a third barrier layer 21 and a fourth barrier layer 23. The first well layer 17a is separated from a well layer 20a included in the first injection layer 15a by the third barrier layer 21. The third well layer 17c is separated from a well layer 20b included in the second injection layer 15b by the fourth barrier layer 23. The third barrier layer 21 and the fourth barrier layer 23 are each thicker than the first barrier layer 17d and the second barrier layer 17e.

In the quantum cascade laser 11, the thick third barrier layer 2 1allows the carriers to be injected from the first injection layer 15a into the first well layer 17a only by a resonant tunneling effect, whereas the thick third barrier layer 21 can inhibit the leakage of carriers from the first well layer 17a of the active region 17 back into the first injection layer 15a. The thick fourth barrier layer 23 can inhibit the leakage of electrons from the third well layer 17c, in which the probability density of electrons is high due to the presence of the thin second barrier layer 17e, into the second injection layer 15b. The thick fourth barrier layer 17c permits to pass the small amount of carriers from the quantum well structure QW to the second injection layer 15b only through the resonant tunneling effect.

Figure 3:
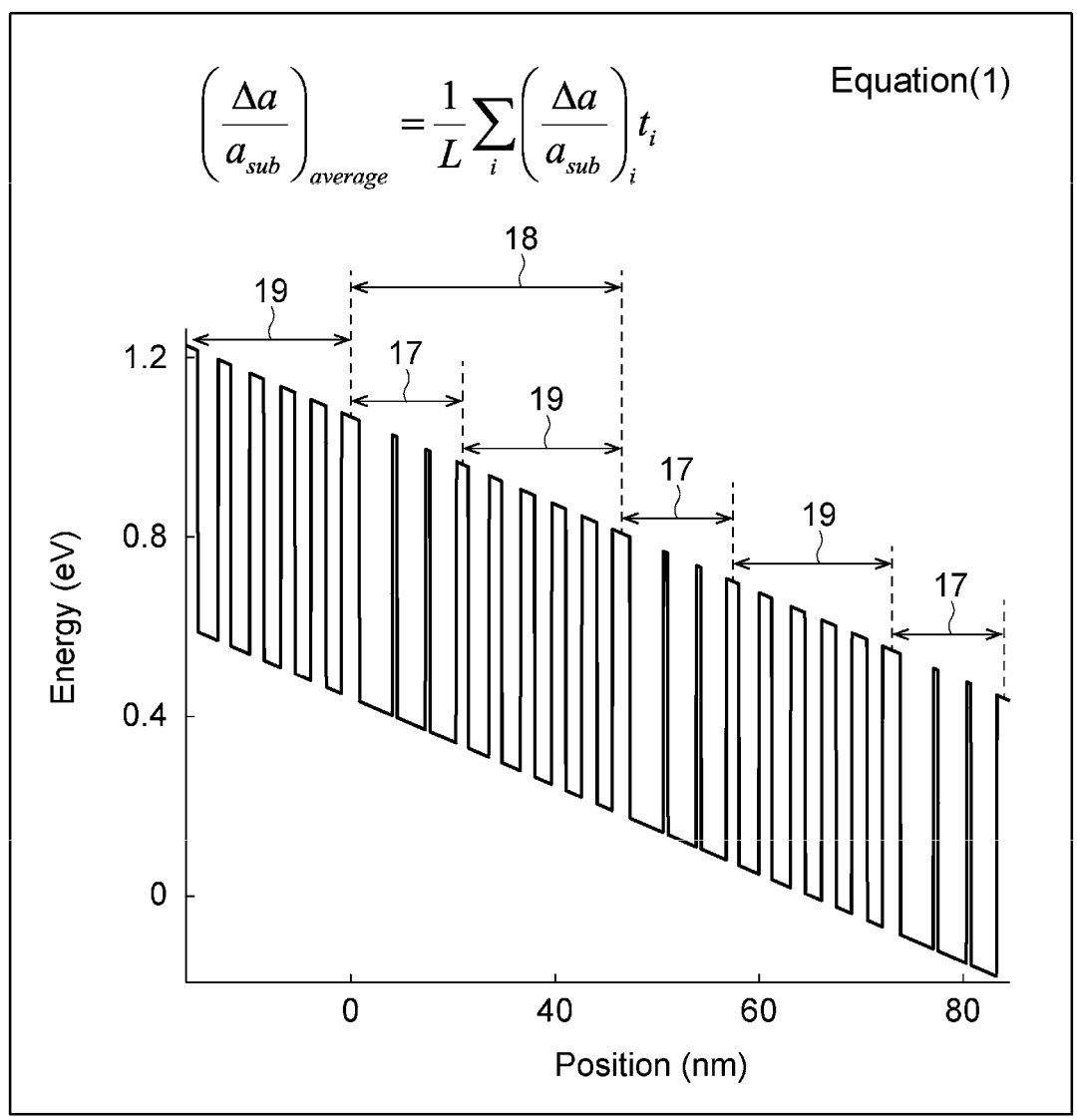
FIG. 3 schematically shows an arrangement of active regions and injection layers in a core region.

FIG. 3 schematically shows the arrangement of the active regions and the injection layers in the core region. Each active region 17 is disposed between the first injection layer 15a and the second injection layer 15b. The first injection layer 15a has a large number of energy levels (specifically, a miniband) that can donate carriers to the active region 17. The second injection layer 15b has a large number of energy levels (specifically, a miniband) that accept carriers from the active region 17. The first injection layer 15a and the second injection layer 15b each include a plurality of well layers and a plurality of barrier layers. The plurality of well layers and the plurality of barrier layers are arranged to form a miniband coupling the upstream active region (17) to the downstream active region (17).

In the core region 13, the well layer 20a of the first injection layer 15a, the third barrier layer 21, the first well layer 17a, the first barrier layer 17d, the second well layer 17b, the second barrier layer 17e, the third well layer 17c, the fourth barrier layer 23, and the well layer 20b of the second injection layer 15b are arranged in sequence in the direction of the first axis Ax1.

The first well layer 17a is defined by the third barrier layer 21 and the first barrier layer 17d. The second well layer 17b is defined by the first barrier layer 17d and the second barrier layer 17e. The third well layer 17c is defined by the second barrier layer 17e and the fourth barrier layer 23. For a better understanding, FIG. 1 illustrates the third barrier layer 21 such that the first injection layer 15a includes a portion of the third barrier layer 21 while the active region 17 includes the remainder of the third barrier layer 21, and also illustrates the fourth barrier layer 23 such that the second injection layer 15b includes a portion of the fourth barrier layer 23 while the active region 17 includes the remainder of the fourth barrier layer 23.

The first barrier layer 17d may have a thickness of 0.3 nm or more to separate the first well layer 17a from the second well layer 17b. The first barrier layer 17d may have a thickness of 1.1 nm or less.

The second barrier layer 17e may have a thickness of 0.3 nm or more to separate the second well layer 17b from the third well layer 17c. The second barrier layer 17e may have a thickness of 1.1 nm or less.

Thickness of first well layer 17a: 5.0 to 8.0 nm, e.g., 6.5 nm

Thickness of second well layer 17b: 4.0 to 7.0 nm, e.g., 5.6 nm

Thickness of third well layer 17c: 3.5 to 6.5 nm, e.g., 5.0 nm

The thickness of the first well layer 17a is larger than or equal to the thickness of the second well layer 17b, and the thickness of the second well layer 17b is larger than or equal to the thickness of the third well layer 17c (thickness of first well layer 17a≥thickness of second well layer 17b≥thickness of third well layer 17c).

For example, the thickness of the second barrier layer 17e may be smaller than or equal to the thickness of the first barrier layer 17d.

The second well layer 17b separates the first barrier layer 17d from the second barrier layer 17e. The first barrier layer 17d and the second barrier layer 17e may have substantially the same thickness within the range of manufacturing variation. The range of manufacturing variation is, for example, −0.1 nm to +0.1 nm.

The core region 13 has a quantum cascade structure including a series of unit cells 18. The quantum cascade structure includes, for example, a stack of 20 to 40 unit cells 18. Each unit cell 18 is composed of one active region 17 and one injection layer 19. As a result, the core region 13 includes alternately arranged active regions 17 and injection layers 19.

Referring again to FIG. 1, the quantum cascade laser 11 may further include a contact layer 25 of a first conductivity type (n-type or p-type), a first cladding layer 27 of the first conductivity type, a grating layer 29, and a second cladding layer 31 of the first conductivity type. The grating layer 29 is disposed between the first cladding layer 27 and the second cladding layer 31. The core region 13 is disposed between the contact and first cladding layers 25 and 27 and the second cladding layer 31. The core region 13 can be optically coupled to the grating layer 29 between the first cladding layer 27 and the second cladding layer 31.

The quantum cascade laser 11 further includes a mesa structure 33, an embedding region 35, and a substrate 37. The mesa structure 33 includes the contact layer 25, the first cladding layer 27, the grating layer 29, the core region 13, and the second cladding layer 31, which are arranged on a main surface 37a of the substrate 37 in the direction of the first axis Ax1. The mesa structure 33 is embedded in the embedding region 35. The mesa structure 33 and the embedding region 35 are arranged on the main surface 37a of the substrate 37 in the direction of a second axis Ax2 crossing the first axis Ax1. The embedding region 35 has semi-insulating properties.

The quantum cascade laser 11 includes a first electrode 39a disposed on the mesa structure 33 and a second electrode 39b disposed on a back surface 37b of the substrate 37.

An example of the quantum cascade laser 11 is shown below:

Substrate 37: n-type InP
Contact layer 25: n-type GaInAs
First cladding layer 27: n-type InP
Grating layer 29: GaInAs
Core region 13: GaInAs/AlInAs, GaInAs/AlAs, or GaAs/AlAs quantum well structure
Second cladding layer 31: n-type InP
Embedding region 35: semi-insulating InP The first well layer 17a, the second well layer 17b, the third well layer 17c, and the well layers 20a and 20b of the injection layers 19 may be formed of a binary, ternary, or quaternary compound containing gallium and indium as group III constituent elements and arsenic as a group V constituent element. The first barrier layer 17d, the second barrier layer 17e, the fourth barrier layer 23, and the barrier layers of the injection layers 19 may be formed of a ternary or quaternary compound containing aluminum as a group III constituent element and arsenic as a group V constituent element. The first well layer 17a, the second well layer 17b, the third well layer 17c, the well layers of the injection layers 19, the first barrier layer 17d, the second barrier layer 17e, the fourth barrier layer 23, and the barrier layers of the injection layers 19 do not contain antimony as a group V constituent element.

An example of the quantum cascade laser 11 is shown below:

Substrate 37: n-type GaAs
Contact layer 25: n-type GaAs or GaInAs
First cladding layer 27: n-type AlGaAs
Grating layer 29: GaAs
Core region 13: GaAs/AlGaAs quantum well structure
Second cladding layer 31: n-type AlGaAs The first well layer 17a, the second well layer 17b, the third well layer 17c, and the well layers of the injection layers 19 may be formed of a binary, ternary, or quaternary compound containing gallium as a group III constituent element and arsenic as a group V constituent element. The first barrier layer 17d, the second barrier layer 17e, the fourth barrier layer 23, and the barrier layers of the injection layers 19 may be formed of a ternary or quaternary compound containing aluminum and gallium as group III constituent elements and arsenic as a group V constituent element.

Figure 4A:
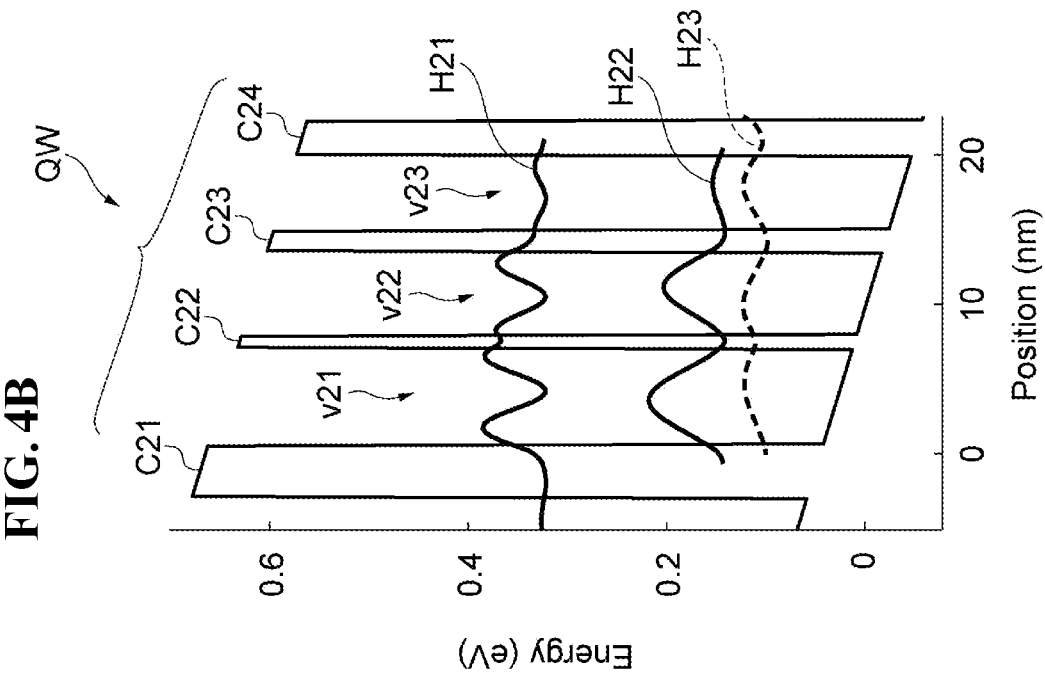
FIG. 4A shows a conduction band diagram and the wavefunctions of three energy levels associated with radiative transitions for an experimental example.
Figure 4B:
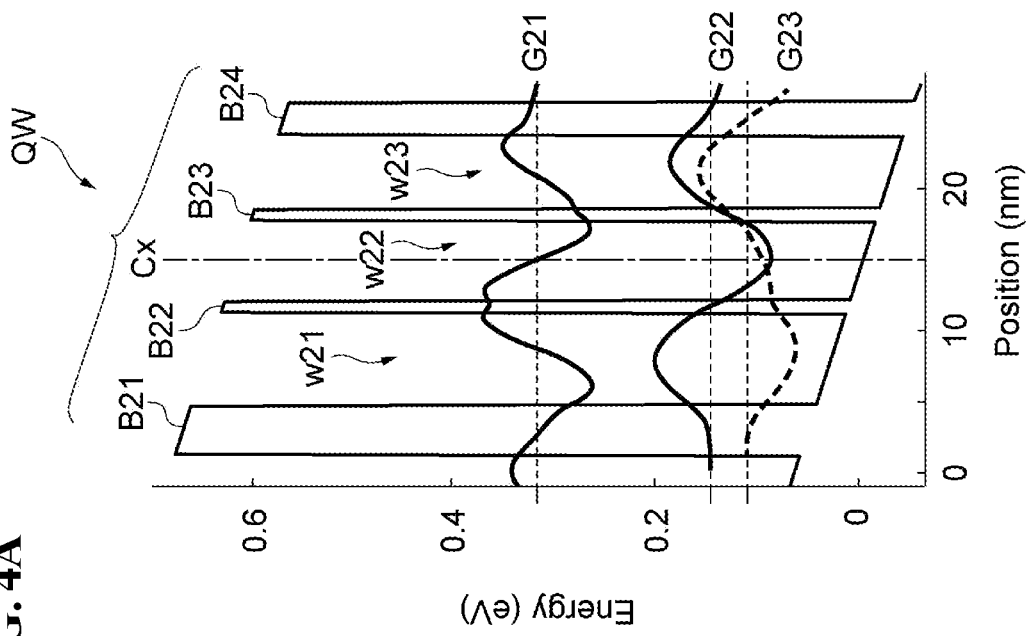
FIG. 4B shows a conduction band diagram and the wavefunctions of three energy levels associated with radiative transitions for an experimental example.

FIGS. 4A and 4B show conduction band diagrams and the wavefunctions of three energy levels associated with radiative transitions for experimental examples. The wavefunctions and the energy levels are determined by numerically solving the Schrödinger equation using models obtained from the materials for the well layers and the barrier layers and the band diagrams. The square of a wavefunction represents the probability density of electrons as a function of position.

Experimental Example 1 (the thickness of a first barrier layer B22 is substantially equal to the thickness of a second barrier layer B23)

Thickness of first well layer W21: e.g., 6.5 nm
Thickness of second well layer W22: e.g., 5.6 nm
Thickness of third well layer W23: e.g., 5.0 nm
Thickness of first barrier layer B22: e.g., 0.9 nm
Thickness of second barrier layer B23: e.g., 0.9 nm
Thickness of third barrier layer B21: e.g., 3.5 nm
Thickness of fourth barrier layer B24: e.g., 2.4 nm
Upper level E1: wavefunction (G21)
Lower level E2: wavefunction (G22)
Relaxation level E3: wavefunction (G23)
Radiative transition dipole moment <z>: 2.6 nm
Well layers (W21, W22, and W23): $Ga_{0.40}In_{0.60}As$
Barrier layers (B21, B22, B23, and B24): $Al_{0.56}In_{0.44}As$ Band offset of conduction band (DEC in FIG. 3): 0.63 eV The first well layer W21 is thicker than the second well layer W22. The second well layer W22 is thicker than the third well layer W23. The third barrier layer B21 is thicker than the fourth barrier layer B24.

The wavefunction (G21) increases as the position coordinate changes from a point on an axis located at the center Cx between the first barrier layer B22 and the second barrier layer B23 (hereinafter referred to as "central axis Cx") toward the first barrier layer B22. The wavefunction (G21) decreases as the position coordinate changes from the point on the central axis Cx toward the second barrier layer B23. The wavefunction (G21) has minima at a point near the third barrier layer B21 and a point near the second barrier layer B23. The wavefunction (G21) has maxima at a point near the first barrier layer B22 and a point near the fourth barrier layer B24. Thus, the wavefunction (G21) shows a waveform that is nearly antisymmetric with respect to the central axis Cx in the quantum well structure QW which includes the three well layers (W21, W22, and W23) (a waveform that can be approximated by an odd function).

The wavefunction (G22) increases as the position coordinate changes from a point on the central axis Cx toward the first barrier layer B22. The wavefunction (G22) increases as the position coordinate changes from the point on the central axis Cx toward the second barrier layer B23. The wavefunction (G22) has a minimum at a point near the center of the second well layer W22. The wavefunction (G22) has maxima at points near the centers of the first well layer W21 and the third well layer W23. Thus, the wavefunction (G22) shows a waveform that is nearly symmetric with respect to the central axis Cx in the quantum well structure QW which includes the three well layers (W21, W22, and W23) (a waveform that can be approximated by an even function). The thickness of the first barrier layer B22 is substantially equal to the thickness of the second barrier layer B23. The equality of thicknesses between the first and second barrier layers B22, B23 relates to symmetric properties of the wavefunctions G21 to G23. The combination of the odd wavefunction G21 and the even wavefunction G22 results in the increase of the probability of radiative transitions. In addition, the wavefunction G23 has a close energy than that of the wavefunction G22. This closeness of the energies promotes a relaxation of the carriers from the wavefunction G22 to the wavefunction G23. Thus, the probability of radiative transitions in the quantum well structure QW increases.

Experimental Example 2 (the thickness of a second barrier layer C23 is larger than the thickness of a first barrier layer C22)

Thickness of first well layer V21: e.g., 6.5 nm
Thickness of second well layer V22: e.g., 5.6 nm
Thickness of third well layer V23: e.g., 5.0 nm
Thickness of first barrier layer C22: e.g., 0.9 nm
Thickness of second barrier layer C23: e.g., 1.5 nm
Thickness of third barrier layer C21: e.g., 3.5 nm
Thickness of fourth barrier layer C24: e.g., 2.4 nm
Upper level: wavefunction (H21)
Lower level: wavefunction (H22)
Relaxation level: wavefunction (H23)
Radiative transition dipole moment <z>: 2.2 nm GaInAs lattice-matched to InP has a gallium fraction of 0.47. AlInAs lattice-matched to InP has an aluminum fraction of 0.48. The band offset of GaInAs/AlInAs is 0.52 eV In a lattice-matched core region, GaInAs has a gallium fraction of 0.465 to 0.475, and AlInAs has an aluminum fraction of 0.475 to 0.485.

An active region having $Ga_{0.40}In_{0.60}As$ well layers and $Al_{0.56}In_{0.44}As$ barrier layers can be strain-compensated. The thin second barrier layer C23 reduces the barrier of the barrier layers in the active region due to increased band offset (the barrier is associated with the thickness and the band offset).

The wavefunction (H21) and the wavefunction (H22) show waveforms that are nearly symmetric with respect to an axis located at the center of the first well layer V22. The wavefunction (H23) shows a waveform that is nearly symmetric with respect to the axis located at the center of the first barrier layer C22 in the well layers (V21 and V22). As shown in FIG. 4B, the energy difference between the wavefunctions H22 and H23 is larger compared to the energy difference between the wavefunctions G22 and G23 shown in FIG. 4A. Thus, the relaxation of carriers from H22 to H23 in the Experimental Example 2 may be slower compared to the relaxation from G22 to G23. Thus, the probability of radiative transitions in the quantum well structure QW in the Experimental Example 2 may be slightly smaller than in the Experimental Example 1.

In the quantum cascade laser 11, the main surface 37a of the substrate 37 may contain InP. The first well layer 17a, the second well layer 17b, and the third well layer 17c may each contain GaInAs. The first barrier layer 17d and the second barrier layer 17e may each contain AlInAs. The core region 13 is strain-compensated.

In the quantum cascade laser 11, the first barrier layer 17d and the second barrier layer 17e are subjected to tensile strain, whereas the first well layer 17a, the second well layer 17b, and the third well layer 17c are subjected to compressive strain. The strain-compensated (lattice-mismatched) core region 13 has a larger band offset than a lattice-matched core region.

In the strain-compensated core region 13, GaInAs has a gallium fraction of 0.2 to 0.5, and AlInAs has an aluminum fraction of 0.3 to 1.0. The gallium fraction of GaInAs and the aluminum fraction of AlInAs are selected so that the average residual strain $(\Delta a/a_{sub})_{average}$ in each unit cell 18 after strain compensation as defined by Equation (1) is 0.3 or less. In Equation (1) shown in FIG. 3, i is a symbol designating a layer in each unit cell 18 and is an integer of 1 to the total number of layers. The substrate 37 has a lattice constant $a_{sub}$, and $\Delta a$ is the difference between the lattice constant of the i-th layer in each unit cell 18 and the lattice constant $a_{sub}$ of the substrate 37. L is the thickness of each unit cell 18. $t_i$ is the thickness of the i-th layer. The injection layers 19 are also strain-compensated.

A method for manufacturing the quantum cascade laser 11 will hereinafter be described. This method begins by providing an n-type InP wafer. A semiconductor laminate is then formed on the n-type InP wafer by growing, in sequence, an n-type InP lower cladding layer, a core region (a repetition of active regions and injection layers), an n-type InP upper cladding layer, and an n+-type GaInAs contact layer, for example, by a molecular beam epitaxy (MBE) method or a metal-organic chemical vapor deposition (MOCVD) method.

A mask is formed on the semiconductor laminate by photolithography and etching. The semiconductor laminate is etched using the mask to form a stripe mesa. An embedding region (Fe-InP) is selectively grown, with the mask remaining on the etched semiconductor laminate. After the embedding region is formed, the mask is removed to expose the n+-type GaInAs contact layer. An upper metal electrode is formed on the n+-type GaInAs contact layer. A lower metal electrode is formed on the back surface of the InP wafer. A substrate product is thus obtained.

After the electrodes are formed, the substrate product is split by cleavage to form a quantum cascade laser chip. If necessary, a-Si/SiO$_2$ dielectric multilayer reflective coatings are formed on the cleaved surfaces.

Whereas the principles of the present invention have been illustrated and described with reference to a preferred embodiment, one skilled in the art would appreciate that modifications can be made to the arrangement and other details without departing from the principles of the invention. The invention is not limited to any particular configuration disclosed in the embodiment. Thus, all changes and modifications that come within the scope and spirit of the claims are to be claimed.

What is claimed is:

1. A quantum cascade laser comprising:
   a core region including a first injection layer, an active region, and a second injection layer, the first injection layer, the active region, and the second injection layer being arranged in sequence in a direction of a first axis;
   a contact layer of a first conductivity type;
   a grating layer;
   a first cladding layer of the first conductivity type;
   a second cladding layer of the first conductivity type; and
   an embedding region arranged in sequence;
   wherein the active region includes a first well layer, a second well layer, a third well layer, a first barrier layer, and a second barrier layer,
   the first barrier layer is disposed between the first well layer and the second well layer and separates the first well layer from the second well layer,
   the second barrier layer is disposed between the second well layer and the third well layer and separates the second well layer from the third well layer,
   the first barrier layer has a thickness of 1.2 nm or less, the second barrier layer has a thickness of 1.2 nm or less,
   wherein the grating layer is disposed between the first cladding layer and the second cladding layer, and
   the core region is disposed between the contact layer and first cladding layer, and the second cladding layer.

2. The quantum cascade laser according to claim 1, wherein
   the core region further includes a third barrier layer separating the first well layer from a well layer of the first injection layer and a fourth barrier layer separating the third well layer from a well layer of the second injection layer,
   the third barrier layer and the fourth barrier layer are each thicker than the first barrier layer and the second barrier layer,
   the first well layer is separated from the well layer of the first injection layer by the third barrier layer, and
   the third well layer is separated from the well layer of the second injection layer by the fourth barrier layer.

3. The quantum cascade laser according to claim 1, further comprising a substrate having a main surface supporting the core region,
   wherein the main surface of the substrate contains InP,
   the first well layer, the second well layer, and the third well layer each contain GaInAs,
   the first barrier layer and the second barrier layer each contain AlInAs, and
   the core region is strain-compensated.

* * * * *